United States Patent
Hashimoto et al.

(10) Patent No.: US 10,174,420 B2
(45) Date of Patent: Jan. 8, 2019

(54) METHOD FOR FORMING OXIDE LAYER, LAMINATED SUBSTRATE FOR EPITAXIAL GROWTH, AND METHOD FOR PRODUCING THE SAME

(71) Applicant: Toyo Kohan Co., Ltd., Chiyoda-ku, Tokyo (JP)

(72) Inventors: Yusuke Hashimoto, Kudamatsu (JP); Teppei Kurokawa, Kudamatsu (JP); Takashi Koshiro, Kudamatsu (JP); Hironao Okayama, Kudamatsu (JP); Tatsuoki Nagaishi, Osaka (JP); Kotaro Ohki, Osaka (JP); Genki Honda, Osaka (JP)

(73) Assignee: Toyo Kohan Co., Ltd., Tokyo (JP)

( * ) Notice: Subject to any disclaimer, the term of this patent is extended or adjusted under 35 U.S.C. 154(b) by 332 days.

(21) Appl. No.: 14/916,363

(22) PCT Filed: Aug. 25, 2014

(86) PCT No.: PCT/JP2014/072094
§ 371 (c)(1),
(2) Date: Mar. 3, 2016

(87) PCT Pub. No.: WO2015/033808
PCT Pub. Date: Mar. 12, 2015

(65) Prior Publication Data
US 2016/0194750 A1    Jul. 7, 2016

(30) Foreign Application Priority Data

Sep. 4, 2013    (JP) .................................. 2013-182899

(51) Int. Cl.
| | | |
|---|---|---|
| C23C 14/35 | (2006.01) | |
| C30B 29/16 | (2006.01) | |
| C23C 14/08 | (2006.01) | |
| C30B 23/02 | (2006.01) | |
| H01L 39/24 | (2006.01) | |
| C23C 14/54 | (2006.01) | |
| C23C 28/00 | (2006.01) | |
| C30B 29/22 | (2006.01) | |

(52) U.S. Cl.
CPC .............. *C23C 14/35* (2013.01); *C23C 14/08* (2013.01); *C23C 14/083* (2013.01); *C23C 14/541* (2013.01); *C23C 28/321* (2013.01); *C23C 28/322* (2013.01); *C23C 28/3455* (2013.01); *C30B 23/02* (2013.01); *C30B 29/16* (2013.01); *H01L 39/2461* (2013.01); *C30B 29/22* (2013.01)

(58) Field of Classification Search
CPC ........ C23C 14/35; C23C 14/08; C23C 14/541
USPC ........................................................ 428/700
See application file for complete search history.

(56) References Cited

U.S. PATENT DOCUMENTS

| | | | |
|---|---|---|---|
| 6,150,034 A | * | 11/2000 | Paranthaman .......... C23C 14/08 428/469 |
| 8,431,515 B2 | | 4/2013 | Takahashi et al. |
| 2010/0167084 A1 | | 7/2010 | Bhattacharya et al. |
| 2012/0108439 A1 | | 5/2012 | Ota et al. |

FOREIGN PATENT DOCUMENTS

| | | |
|---|---|---|
| JP | 2002-509988 | 4/2002 |
| JP | 2004-6063 | 1/2004 |
| JP | 2008-310986 | 12/2008 |
| JP | 2010-7164 | 1/2010 |
| JP | 2010-238634 | 10/2010 |
| JP | 2010238634 A * | 10/2010 |
| JP | 2011-18598 | 1/2011 |
| JP | 2012-243499 | 12/2012 |
| WO | 99/50471 | 10/1999 |

OTHER PUBLICATIONS

He et al., Physica C, 275, 155-161, 1997.*
Tranlsation of JP 2010-238634, Oct. 21, 2010.*
He, Qing, et al., "Deposition of Biaxially-Oriented Metal and Oxide Buffer-Layer Films on Textured Ni Tapes: New Substrates for High-Current, High Temperature Superconductors", Physica C, 1997, vol. 275, No. 1-2, pp. 155-161.
Kreiskott, S., et al., "High JC YBCO Films on Biaxially Textured Ni with Oxide Buffer Layers Deposited Using Evaporation and Sputtering Techniques", Physica C, 2003, vol. 383, No. 4, pp. 306-314.
European Search Report, based on co-pending European Patent Application 14843041, dated Apr. 3, 2017—5 Pages.
International Search Report dated Nov. 18, 2014 relating to co-pending International Application No. PCT/JP2014/072094, filed Aug. 25, 2014—4 Pages.

* cited by examiner

*Primary Examiner* — Hui H Chin
(74) *Attorney, Agent, or Firm* — McCarter & English, LLP (57) ABSTRACT

This invention provides a method for forming an oxide layer on a metal substrate, which enables manufacture of an oxide layer with improved crystal orientation in comparison with that of the outermost layer of a metal substrate. The method for forming an oxide layer on a metal substrate 20 via RF magnetron sputtering comprises a step of subjecting the crystal-oriented metal substrate 20 exhibiting a c-axis orientation of 99% on its outermost layer to RF magnetron sputtering while adjusting the angle α formed by a perpendicular at a film formation position 20a on the metal substrate 20 and a line from the film formation position 20a to a point 10a at which the perpendicular magnetic flux density is zero on the target 10 located at the position nearest to the film formation position 20a to 15 degrees or less.

12 Claims, 2 Drawing Sheets

METHOD FOR FORMING OXIDE LAYER, LAMINATED SUBSTRATE FOR EPITAXIAL GROWTH, AND METHOD FOR PRODUCING THE SAME

RELATED APPLICATIONS

This application is a national stage application filed under 35 USC 371 of PCT/JP2014/072094, filed Aug. 25, 2014, which claims the benefit of Japanese Patent Application No. 2013-182899, filed Sep. 4, 2013, all of which are incorporated herein, in entirety, by reference.

TECHNICAL FIELD

The present invention relates to a method for forming an oxide layer, a laminated substrate for epitaxial growth, and a method for producing the same.

BACKGROUND ART

A superconducting wire is manufactured by superposing a metal substrate and one or more intermediate layers composed of oxides, such as cerium oxide ($CeO_2$), yttria-stabilized zirconia (YSZ), and yttrium oxide ($Y_2O_3$), and a buffer layer on top of each other, so as to form a laminated substrate for a superconducting wire (i.e., a laminated substrate for epitaxial growth), and further superposing a superconducting layer (RE123 film, RE: Y, Gd, Ho, Sm, Dy, or the like) thereon.

It is known that, as the degree of crystal orientation of a superconducting layer is improved, the resulting superconducting wire exhibits improved superconducting properties. A superconducting layer is manufactured via, for example, vapor-phase growth techniques, such as sputtering or pulsed laser deposition (PLD), or liquid-phase growth techniques, such as metal organic deposition (MOD), by preparing a laminated substrate for a superconducting wire with a crystal-oriented surface layer and allowing the crystals of an oxide superconducting material to grow in a given direction on the laminated substrate. In order to improve the degree of crystal orientation of a superconducting layer, accordingly, it is effective to improve the crystal orientation of the laminated substrate for a superconducting wire.

As a technique for manufacturing a laminated substrate for a superconducting wire with excellent crystal orientation (i.e., a laminated substrate for epitaxial growth), for example, Patent Document 1 discloses a method of manufacturing a substrate comprising: a process for preparing a base material wherein a nickel layer is formed on a copper layer by a plating method; a process for heat-treating the nickel layer at 800° C. to 1,000° C.; and a process for epitaxially growing an intermediate layer, such as a $CeO_2$ thin film, on the nickel layer after the process for heat-treating the nickel layer. The biaxial orientation of the intermediate layer is improved by such method. In addition, Patent Document 2 discloses a method for producing an oxide superconducting thin-film wire comprising an oriented metal substrate, an intermediate layer laminated thereon, and an oxide superconducting layer laminated thereon, wherein the process for forming the intermediate layer at least comprises a process for forming a $CeO_2$ layer on the oriented metal substrate via RF sputtering and a process for forming a $Y_2O_3$ layer on the $CeO_2$ layer via electron beam evaporation.

PRIOR ART DOCUMENTS

Patent Documents

Patent Document 1: JP 2011-018598 A
Patent Document 2: JP 2012-243499 A

SUMMARY OF THE INVENTION

Objects to be Attained by the Invention

As described above, a substrate that is manufactured by orienting the crystals on the outermost layer of a metal substrate in advance and epitaxially growing an oxide layer while maintaining the crystal orientation of the outermost layer of the metal substrate is required to have an oxide layer exhibiting improved crystal orientation. In addition, there has not previously been any technique intended to improve the crystal orientation of the oxide layer instead of that of the outermost layer of the metal substrate.

Accordingly, it is an object of the present invention to provide a method for forming an oxide layer on a metal plate that enables formation of an oxide layer exhibiting improved crystal orientation compared with that on the outermost layer of the metal substrate. It is another object of the present invention to provide a laminated substrate for epitaxial growth comprising an oxide layer exhibiting excellent crystal orientation with the use of the method for forming an oxide layer described above. In the present invention, the term "laminated substrate for epitaxial growth" refers to a laminated substrate comprising a metal substrate and an oxide layer formed thereon. The term also refers to, for example, a laminated substrate for a superconducting wire used for forming a superconducting layer on such laminated substrate, so as to manufacture a superconducting wire, a substrate used for forming a photovoltaic layer of Si, or a laminated substrate for a semiconductor for forming a semiconducting layer.

Means for Attaining the Objects

The present inventors have conducted concentrated studies in order to attain the above objects. As a result, they discovered that such objects could be attained by forming an oxide layer on a metal substrate via RF magnetron sputtering, and regulating the positional relationship between the position of the target for constituting the oxide layer and the position at which film formation takes place on a metal substrate within a particular range, thereby completing the present invention.

Specifically, the present invention is summarized as follows.

(1) A method for forming an oxide layer on a metal substrate via RF magnetron sputtering,
the method comprising a step of subjecting a crystal-oriented metal substrate exhibiting a c-axis orientation rate of 99% or higher on the outermost layer to RF magnetron sputtering by adjusting the angle firmed by a perpendicular at a film formation position on the metal substrate and a line from the film formation position to a point at which the perpendicular magnetic flux density is zero on a target located at the position nearest to the film formation position to 15 degrees or less.
(2) The method for forming an oxide layer according to (1), wherein the outermost layer exhibits a Δφ value of 6 degrees or less.

(3) The method for forming an oxide layer according to (1) or (2), wherein the RF magnetron sputtering is carried out by adjusting the temperature of the metal substrate to 350° C. to below 600° C.

(4) A method for manufacturing a laminated substrate for epitaxial growth comprising a metal substrate and an oxide layer formed thereon, the method comprising:

a step of preparing a crystal-oriented metal substrate exhibiting a c-axis orientation rate of 99% or higher on the outermost layer; and a step of forming an oxide layer on the metal substrate via RF magnetron sputtering by adjusting the angle formed by a perpendicular at a film formation position on the metal substrate and a line from the film formation position to a point at which the perpendicular magnetic flux density is zero on a target located at the position nearest to the film formation position to 15 degrees or less.

(5) The method for manufacturing a laminated substrate for epitaxial growth according to (4), wherein the oxide layer is composed of $CeO_2$.

(6) The method for manufacturing a laminated substrate for epitaxial growth according to (4) or (5), wherein the outermost layer of the metal substrate is composed of Ni or an Ni alloy.

(7) A laminated substrate for epitaxial growth comprising a metal substrate and an oxide layer formed thereon, wherein the $\Delta\varphi_c$ value of the oxide layer and the $\Delta\varphi_m$ value of the outermost layer of the metal substrate satisfy the correlation represented by the formula: $\Delta\varphi_c \leq \Delta\varphi_m - 0.5$ degrees.

(8) A laminated substrate for epitaxial growth comprising a metal substrate and an oxide layer formed thereon, wherein the $\Delta\omega_c$ value of the oxide layer and the $\Delta\omega_m$ value of the outermost layer of the metal substrate satisfy the correlation represented by the formula: $\Delta\omega_c \leq \Delta\omega_m - 1.2$ degrees.

This description includes part or all of the content as disclosed in the description and/or drawings of Japanese Patent Application No, 2013-182899, which is a priority document of the present application.

Effects of the Invention

According to the present invention, an oxide layer exhibiting a $\Delta\varphi$ value and a $\Delta\omega$ value improved by 0.5 degrees or more and 1.2 degrees or more, respectively, compared with the outermost layer of the metal substrate can be formed. Regarding the crystal orientation of the resulting oxide layer, also, an area exhibiting the deviation of crystal direction by a particular extent or more from the gi yen crystal direction can be significantly reduced.

EMBODIMENTS FOR CARRYING OUT THE INVENTION

Hereafter, the present invention is described in detail.

The method for forming an oxide layer according to the present invention comprises a step of performing RE magnetron sputtering by adjusting the angle formed by a perpendicular at a film formation position on a crystal-oriented metal substrate exhibiting a c-axis orientation rate of 99% or higher on the outermost layer and a line from the film formation position to a point at which the perpendicular magnetic flux density is zero on a target located at the position nearest to the film formation position to 15 degrees or less. By providing a superconducting layer as an upper layer, a laminated substrate for epitaxial growth, such as a laminated substrate for a superconducting wire serving as a substrate when producing a superconducting wire, can be manufactured. Hereafter, an embodiment in which a laminated substrate for a superconducting wire is manufactured is mainly explained, although the present invention is not limited thereto.

1. Metal Substrate

A metal substrate is required to have a c-axis orientation rate of 99% or higher on the outermost layer. The c-axis orientation rate is determined based on the diffraction peak intensity on the (200) plane via θ/2θ X-ray diffraction analysis, and it represents an area in which the (200) plane is perpendicular to the surface of the metal substrate. Specifically, a c-axis orientation rate (%) is determined in accordance with the formula: I (200)/ΣI(hkl)×100(%). The outermost layer preferably exhibits an in-plane orientation degree ($\Delta\varphi$) of 6 degrees or less and an out-of-plane orientation degree ($\Delta\omega$) of 8 degrees or less. When it is used for a superconducting wire, such values are particularly preferably 5 degrees or less and 6 degrees or less, respectively. Such values can be determined via electron back scatter diffraction (EBSD) analysis of the outermost layer. The term "EBSD method" refers to a technique of analyzing the crystal direction by means of reflected electron diffraction of Kikuchi lines (i.e., the Kikuchi pattern) generated when an electron beam is applied to a sample under a scanning electron microscope (SEM). In general, an electron beam is applied to the surface of the outermost layer, and the information obtained upon electron beam application is directional information up to the depth of several tens of nanometers to which the electron beam penetrates; that is, directional information regarding the outermost layer.

The outermost layer of the metal substrate can comprise various types of metals without particular limitation. Examples of metals include one or more members selected from the group consisting of nickel, copper, silver, tungsten, vanadium, chromium, molybdenum, manganese, aluminum, iron, and palladium and alloys thereof, with nickel and a nickel alloy being particularly preferable. When a metal substrate is composed of a plurality of layers and the outermost layer contains nickel or a nickel alloy, the outermost layer is oxidized by the oxide layer formed on the metal substrate, and distortion of crystal orientation can be prevented.

Also, it is sufficient if the outermost layer of the metal substrate has the particular crystal orientation as described above. In addition, another metal layer, such as a non-crystal-oriented metal layer, may be present as the lower layer. According to an embodiment of the present invention, the metal substrate comprises a non-magnetic metal plate and a high-reduction rolled metal layer on which crystals are oriented via thermal treatment (hereafter, it is referred to as a "crystal-oriented metal layer") formed on the metal substrate. A high-reduction rolled metal layer may be provided on one surface of the non-magnetic metal plate, or two high-reduction rolled metal layers may be provided on both surfaces of the metal plate.

The term "non-magnetic" used herein refers to a state in which the relevant metal plate is not ferromagnetic at 77 K or higher; that is, a Curie point or a Neel point thereof exists at 77 K or below, and it is paramagnetic or and ferromagnetic at a temperature 77 K or higher. As such a non-magnetic metal plate, a nickel alloy or austenitic stainless steel plate is preferably used since it has excellent strength and serves as a reinforcing material. In general, austenitic stainless steel is in a non-magnetic state at room temperature; that is, in a state where the metal texture is 100% austenite (γ) phase. When an (α') phase transformation point (Ms point) of a martensite, which is ferromagnetic, is at 77 K or higher, in contrast, an α' phase, which is ferromagnetic at a liquid nitrogen temperature, may appear. Accordingly, an austenitic stainless steel plate with an Ms point designed at 77 K or below is preferably used as a metal plate for a superconducting wire to be used at a temperature below a liquid nitrogen temperature (77 K). As an austenitic stainless steel plate, a metal plate, such as SUS316, SUS316L, SUS310, or SUS305, is preferably used because such material has a stable γ phase with an Ms point designed to be sufficiently lower than 77 K, and it is widely available at a relatively low cost. A metal plate having thickness of 20 μm or more is generally applicable herein. From the viewpoint of a reduced thickness and the strength of a superconducting wire, a thickness of a metal plate is preferably 50 μm to 100 μm, although the thickness is not limited to such range.

In the present invention, the term "high-reduction rolled metal layer" refers to a metal layer, which was cold-rolled at reduction of preferably 90% or higher, and more preferably at high reduction of 95% or higher, at the time of final rolling, but was not subjected to thermal treatment for recrystallization after cold-rolling. Such metal layer retains a rolled tissue assembly developed as a result of cold rolling. When a reduction is less than 90%, metal may not be oriented in the later process of thermal treatment. A high-reduction rolled metal layer used for a metal substrate can comprise one or more members selected from the group consisting of nickel, copper, silver, tungsten, vanadium, chromium, molybdenum, manganese, aluminum, and iron, or an alloy thereof, although metals are not particularly limited thereto. Because of ease of achieving a higher degree of biaxial crystal orientation and satisfactory lattice matching with the intermediate layer, the high-reduction rolled metal layer preferably comprises copper or a copper alloy when it is used for a superconducting wire, in particular. A high-reduction rolled metal layer may contain a very small amount (about 1% or less) of an element in order to further improve biaxial crystal orientation by the thermal treatment. Examples of such an additional element include one or more types of elements selected from among Ag, Sn, Zn, Zr, O, and N. These additional elements and metals contained in the high-reduction rolled metal layer form a solid solution. If the amount thereof to be added exceeds 1%, impurities such as oxides other than a solid solution increase. This may adversely affect the crystal orientation.

A metal foil can be preferably used as a high-reduction rolled metal layer. Such metal foil can be generally obtained. Examples thereof include high-reduction rolled copper foil (HA Foil (trade name)) manufactured by JX Nippon Mining & Metals Corp. and high-reduction rolled copper foil (MX Foil (trade name)) manufactured by Hitachi Cable, Ltd.

In general, it is preferable that a thickness of a high-reduction rolled metal layer be from 7 μm to 70 μm, so as to maintain the strength of the high-education rolled metal layer and improve the processability at the time of later processing of a superconducting wire.

A laminate of a non-magnetic metal plate and a high-reduction rolled metal layer can be prepared in accordance with various techniques. A particularly preferable technique is surface activation bonding. According to the technique of surface activation bonding, the surface of the non-magnetic metal plate and that of the high-reduction roiled metal layer are subjected to sputter etching treatment, respectively, so as to remove the surface adsorption layer and the surface oxide film for surface activation, and activated two surfaces are then bonded to each other by cold rolling.

Specifically, for example, a non-magnetic metal plate and a high-reduction rolled metal layer are prepared as elongated coils having a width of 150 mm to 600 mm, and they are mounted on recoiler portions of a surface activation bonding device, respectively. The non-magnetic metal plate and the high-reduction rolled metal layer conveyed from the recoiler portions are continuously conveyed to a surface activation treatment step where two surfaces to be bonded are first activated and then subjected to cold rolling.

The surface activation treatment is carried out by performing sputter etching treatment wherein the non-magnetic metal plate and the high-reduction rolled metal layer to be bonded are designated as electrodes at one side, which are connected to a ground, respectively, and a glow discharge is generated by applying an AC current of 1 to 50 MHz to a region between such electrodes and the other electrodes, which are supported in an insulated manner. As an inert gas, argon, neon, xenon, krypton or a gas mixture containing at least one kind of gas selected therefrom is applicable.

In the sputter etching treatment, surfaces to be bonded of the non-magnetic metal plate and the high-reduction rolled metal layer are subjected to sputtering by an inert gas, so that at least surface adsorption layers are removed. In addition, surface oxide films may be removed, so as to activate the surfaces to be bonded. During this sputter etching treatment, the electrodes connected to the ground are in the form of cooling rolls. Thus, the elevation of temperature of the respective materials to be conveyed is prevented.

Thereafter, the non-magnetic metal plate and the high-reduction rolled metal layer are continuously conveyed to a pressure bonding roll step, so that the activated surfaces are pressure-bonded to each other. When an $O_2$ gas or the like exists in the pressure bonding atmosphere, the activated surfaces are oxidized again during the conveyance, and the adhesion therebetween is adversely affected. A laminate, which is formed by bonding the non-magnetic metal plate and the high-reduction rolled metal layer to each other in close contact through the above-mentioned pressure bonding step, is conveyed to a winding step, and it is wound in this step.

In the above-mentioned sputter etching step, materials adsorbed onto the surfaces to be bonded are completely removed; however, it is not necessary to completely remove a surface oxidized layer for the following reasons. That is, even if the oxidized layer remains on the entire surface, the bonding property between the non-magnetic metal plate and the high-reduction rolled metal layer can be maintained by increasing a reduction rate in the bonding step and exposing a base by making use of friction on the surfaces to be bonded.

If an oxidized layer is to be completely removed by dry etching, a high plasma output or etching for a long time becomes necessary, and a temperature of a material is elevated disadvantageously. When the temperature of the high-reduction rolled metal layer is elevated to a level equivalent to or higher than the recrystallization initiation temperature of metals in the high-reduction rolled metal layer, the high-reduction rolled metal layer undergoes recrystallization during sputter etching treatment. As a result, the crystal orientation of the high-reduction rolled metal layer is determined prior to bonding. When the biaxially crystal-oriented, high-reduction rolled metal layer is rolled, distortion is introduced into the high-reduction rolled metal layer, and the biaxial crystal orientation of the high-reduction rolled metal layer deteriorates. In the sputter etching step, accordingly, it is necessary to maintain the temperature of the high-reduction rolled metal layer at a temperature below the metal recrystallization initiation point. When a copper foil is used as a high-reduction rolled metal layer, for example, the temperature of the copper foil is maintained below 150° C. The temperature of the copper foil is preferably maintained at 100° C. or below, so as to maintain the metal texture of the high-reduction rolled metal layer in the form of the rolled texture.

In the treatment where sputter etching is applied to the non-magnetic metal plate, also, the treatment with a high plasma output or the elevation of temperature of the metal plate to the metal recrystallization initiation point or higher via the treatment for a long period of time may lead to the elevated temperature of the high-reduction rolled metal layer due to a contact between the metal plate and the high-reduction rolled metal layer at the time of rolling, the recrystallization of the high-reduction rolled metal layer may take place simultaneously with the rolling, and the biaxial crystal orientation may deteriorate. In the treatment where sputter etching is applied to the non-magnetic metal plate, accordingly, it is preferable that the temperature of the metal plate be maintained below the metal recrystallization initiation point in the high-reduction rolled metal layer. When a copper foil is used as a high-reduction rolled metal layer, for example, the temperature of the copper foil is maintained below 150° C., and preferably within a range of room temperature to 100° C.

After the surface of the non-magnetic metal plate and that of the high-reduction rolled metal layer are activated in the manner described above, they are bonded to each other using pressure rolls in the vacuum. In such a case, a higher degree of vacuum is preferable from the viewpoint of the prevention of re-adsorption to the surface, although the degree of vacuum of $10^{-5}$ Pa to $10^{-2}$ Pa is sufficient. In addition, the bonding strength between the non-magnetic metal plate and the high-reduction rolled metal layer is lowered due to oxygen re-adsorption to the surface of the non-magnetic metal plate and to that of the high-reduction rolled metal layer. Accordingly, it is also preferable to perform the bonding using pressure rolls in a non-oxidizing atmosphere, for example, in an inert gas atmosphere such as an Ar gas.

Pressure application using pressure rolls is performed for ensuring a bonded area of a bonding boundary between the non-magnetic metal plate and the high-reduction rolled metal layer as well as for exposing a base by peeling a partially surface-oxidized film layer by making use of friction which occurs in the bonding boundary at the time of rolling reduction. It is preferable to apply a pressure of 300 MPa or more. Particularly, both the non-magnetic metal plate and the high-reduction rolled metal layer are hard materials. Accordingly, it is preferable to apply a pressure of 600 MPa to 1.5 GPa. A pressure exceeding 1.5 GPa may be applied, and it is confirmed that the crystal orientation does not deteriorate after the thermal treatment at reduction of up to 30%. It is preferable that pressure be applied to adjust a reduction to below 5%. With the application of pressure that results in a reduction exceeding 30%, cracks may occur on the surface of the high-reduction rolled metal layer, and the crystal orientation of the crystal-oriented metal layer may deteriorate after rolling and thermal treatment.

After the metal plate and the high reduction rolled metal layer are bonded to each other, the resultant is thermally treated, and the crystals of the high-reduction rolled metal layer are oriented, so as to prepare a crystal-oriented metal layer. Thermal treatment is performed at, for example, 150° C. or higher. While the duration of thermal treatment varies depending on temperature, for example, thermal treatment may be performed for 1 to 10 hours at 400° C., and for several seconds to about 5 minutes at high temperature of 700° C. or higher. If the temperature for thermal treatment is too high, a high-reduction rolled metal layer is more likely to undergo secondary recrystallization, and crystal orientation deteriorates. Accordingly, thermal treatment is preferably performed at 150° C. to 1000° C. In particular, crystal orientation can be improved at high temperature of 700° C. or higher. In addition, a substrate is exposed to high temperature of 600° C. to 900° C. in the later step of forming a superconducting layer when it is used as a superconducting wire. Accordingly, thermal treatment is preferably carried out at 700° C. to 900° C. When the crystal-oriented metal layer serves as the outermost layer of the metal substrate, it is necessary to adjust a c-axis orientation rate of the crystal-oriented metal layer to 99% or higher via thermal treatment. In addition, the $\Delta\varphi$ value and the $\Delta\omega$ value are preferably regulated to be within particular ranges. More preferably, thermal treatment is performed in a stepwise manner, such that thermal treatment is first performed at low temperature and then at high temperature. Thus, the degree of crystal orientation and surface roughness of a crystal-oriented metal layer and a protective layer that would be formed later can be improved. It is particularly preferable that thermal treatment be first performed at 200° C. to 400° C. and then at 800° C. to 900° C.

The metal substrate according to the present invention preferably comprises a protective layer formed on a crystal-oriented metal layer. In such a case, a protective layer serves as the outermost layer of the metal substrate. A protective layer comprises nickel, palladium, silver, or an alloy thereof, with nickel or a nickel alloy being preferable, although the metals are not limited thereto. A nickel-containing protective layer has excellent acid resistance. In the presence of a protective layer, distortion of crystal orientation, which may occur upon formation of an oxide layer of metals contained in the crystal-oriented metal layer at the time of formation of an oxide layer made of $CeO_2$ or the like on the protective layer, can be prevented. As an element to be contained, such as a nickel, palladium, or silver alloy, an element that leads to decreased magnetism is preferable, and examples thereof include Cu, Sn, W, and Cr. In addition, impurities may be contained, as long as they do not adversely affect the crystal orientation.

When a protective layer is too thin, metals in the crystal-oriented metal layer may diffuse onto the surface of the protective layer and oxidize the surface at the time when an oxide layer and a superconducting layer are superposed on the protective layer during the production of a superconducting wire. When a protective layer is too thick, in contrast, the protective layer becomes deteriorated in crystal orientation, and the plating distortion increases. The thickness of a protective layer is appropriately determined in view of these possibilities. Specifically, a thickness is preferably from 1 μm to 5 μm.

The laminate of the biaxially crystal-oriented non-magnetic metal plate resulting from thermal treatment and the crystal-oriented metal layer may be plated, so that a protective layer maintaining the crystal orientation of the crystal-oriented metal layer can be formed on the crystal-oriented metal layer. Plating can be performed under appropriate conditions that would minimize the plating distortion of a protective layer. The term "plating distortion" used herein refers to the degree of distortion that takes place within a plated film when a base such as a metal plate is plated. When a layer made of nickel is formed as a protective layer, for example, plating may be performed with the use of a Watts bath or a sulfamate bath, which has been known as a plating bath. Use of a sulfamate bath is particularly preferable because the plating distortion of a protective layer can be easily reduced. While a preferable composition of a plating bath is as described below, the composition is not limited thereto.
(Watts Bath)
Nickel sulfate: 200-300 g/l
Nickel chloride: 30-60 g/l
Boric acid: 30-40 g/l
pH: 4-5
Bath temperature: 40° C.-60° C.
(Sulfamate Bath)
Nickel sulfamate: 200-600 g/l
Nickel chloride: 0-15 g/l
Boric acid: 30-40 g/l
Additive: Appropriate quantity
pH: 3.5-4.5
Bath temperature: 40° C.-70° C.

Current density when plating is performed is not particularly limited and it is appropriately determined in view of a balance thereof with the time required for plating. When a plated film of 2 μm or more is formed as a protective layer, for example, low current density may result in a longer period of time required for plating, a decreased line speed to secure the time therefor, lower productivity, and difficulty in plating control. In general, accordingly, current density is preferably 10 A/dm$^2$ or more. Also, the upper limit of current density differs depending on the type of plating bath, and it is not particularly limited. For example, current density is preferably 25 A/dm$^2$ or less in the case of Watts bath, and it is preferably 35 A/dm$^2$ or less in the case of sulfamate bath. When current density exceeds 35 A/dm$^2$, in general, a good crystal orientation may not be obtained due to so-called "plating burning."

When an oxide may be present on the surface of the protective layer, an oxide is removed via thermal treatment. Also, the protective layer may undergo the formation of micropits on the surface depending on plating conditions and the like. In such a case, the surface can be smoothed by leveling via further thermal treatment after plating, if necessary. It is preferable that the protective layer be thermally treated in a reducing atmosphere of about 1 Pa, such as Ar gas containing 3% of H$_2$ by moles, at 650° C. to 1000° C. for 5 to 30 minutes.

A thickness of the metal substrate varies depending on applications of the final form of the laminated substrate for epitaxial growth or other factors, and it is not particularly limited. For example, it is preferably from 50 μm to 200 μm. When a thickness of the substrate is less than 50 μm, the substrate cannot retain its mechanical strength. When a thickness is more than 200 μm, in contrast, the substrate may not be able to retain processability required for the processing of a superconducting wire.

When it is used as a superconducting wire, in particular, a non-magnetic metal plate and a high-reduction rolled metal layer may be bonded to each other, and treatment aimed at reduction of surface roughness Ra of the high-reduction rolled metal layer may then be performed, in order to satisfactorily maintain the crystal orientation of an intermediate layer and a superconducting layer to be further superposed by epitaxial growth onto a protective layer before thermal treatment, according to need. Specifically, methods, such as rolling reduction using pressure rolls, buffing, electropolishing, or electrolytic abrasive grain polishing, can be employed. By such methods, surface roughness Ra is preferably adjusted to, for example, 20 nm or less, and more preferably 10 nm or less.

By forming an oxide layer on the crystal-oriented metal substrate via RF magnetron sputtering, a laminated substrate for epitaxial growth can be manufactured. The composition of an oxide layer formed on a metal substrate is not particularly limited. When it is used for a superconducting wire, for example, an oxide having a fluorite type, pyrochlore-type, rock salt-type, or perovskite-type crystal structure is preferable. Specific examples thereof include $CeO_2$, MgO, $SrTiO_3$, $La_2O_3$, YSZ, and $Y_2O_3$. Such oxides can moderate differences in the constant of crystals and the crystal orientation between the metal substrate and the superconducting layer and prevent metal atoms from diffusing from the metal substrate to the superconducting layer. When the outermost layer of a metal substrate contains nickel and the crystals are biaxially oriented thereon, an oxide having a fluorite-type structure, such as $CeO_2$, enables formation of an oxide layer with excellent crystal orientation through the method of film formation according to the present invention. Thus, the use thereof is particularly preferable. While the oxide layer thickness is preferably in the range of from 50 nm to 300 nm, the thickness is not limited thereto.

In RF magnetron sputtering, the oxide is designated as the target, a magnet is provided on the back surface of the target to generate a magnetic field, gas ion atoms collide with the target surface, the ejected secondary electrons are captured by the Lorentz force, and inert gas ionization is promoted with the aid of the cyclotron motion. Since negative ions and secondary electrons are captured in the magnetic field, an increase in the temperature of the metal substrate can be suppressed, gas ionization is promoted with the aid of the captured electrons, and the film formation speed can thus be increased.

Figure 1:
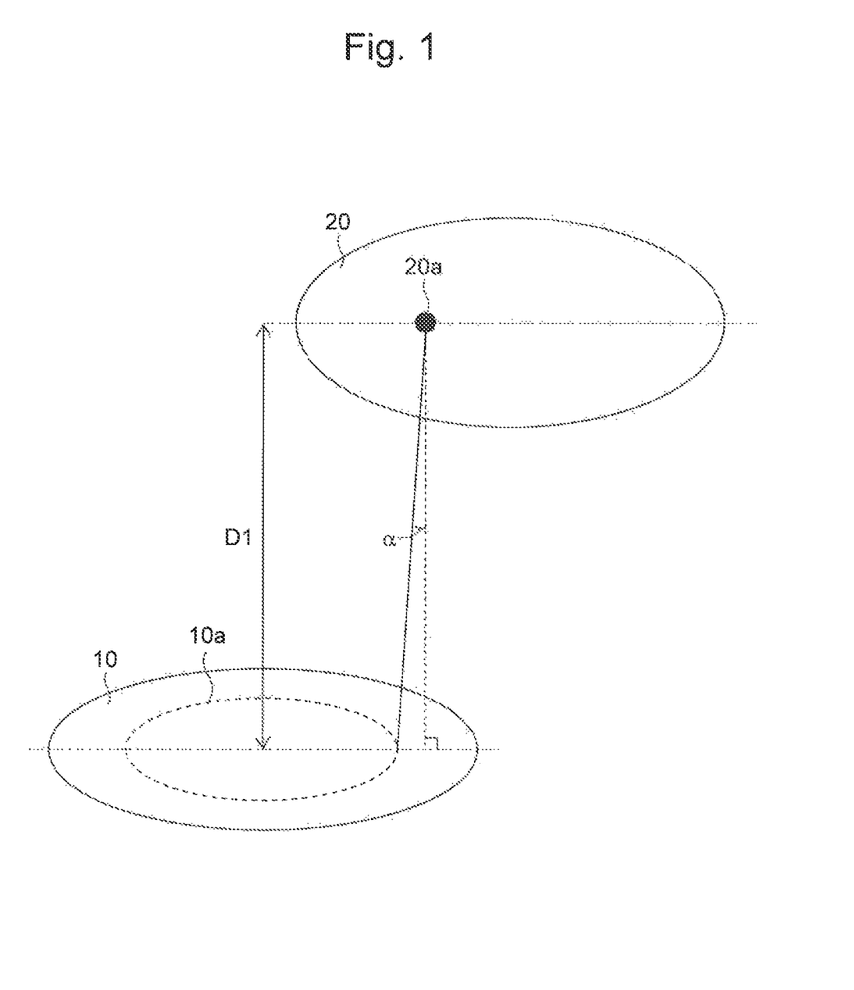
FIG. 1 illustrates the method for forming an oxide layer according to the present invention.

In the present invention, an oxide layer is formed via RF magnetron sputtering by adjusting the angle α formed by a perpendicular at a film formation position 20a on the metal substrate 20 and a line from the film formation position 20a to a point 10a at which the perpendicular magnetic flux density is zero on the target 10 located at the position nearest to the film formation position 20a to 15 degrees or less, as shown in FIG. 1. At the point at which the perpendicular magnetic flux density is zero, the magnetic flux density in the perpendicular direction formed by the magnetic lines of flux from the magnet provided on the back surface of the target becomes zero, and an erosion region in which the target is eroded is formed surrounding such point. By adjusting the angle α to 15 degrees or less, the crystal orientation and the particle diameter of the outermost layer of the metal substrate as the lower layer can be carried over to the oxide layer, and the Δφ value and the Δω value of the resulting oxide layer can be improved by 0.5 degrees or more and 1.2 degrees or more, respectively. Specifically, a laminated substrate for epitaxial growth that can satisfy the correlation represented by the formula: $\Delta\varphi_c \leq \Delta\varphi_m - 0.5$ degrees and the correlation represented by the formula: $\Delta\omega_c \leq \Delta\omega_m - 1.2$ degrees, wherein the in-plane orientation degree and the out-of-plane orientation degree of the oxide layer are designated as $\Delta\varphi_c$ and $\Delta\omega_m$, respectively, and the in-plane orientation degree and the out-of-plane orientation degree of the outermost layer of the metal substrate are designated as $\Delta\varphi_m$ and $\Delta\omega_m$, respectively, can be obtained. It is particularly preferable that the angle α be adjusted to 13.5 degrees or less. Thus, the $\Delta\varphi$ value and the $\Delta\omega$ value of the oxide layer can be improved by 1 degree or more and 2 degrees or more, respectively, in comparison with those of the outermost layer of the metal substrate. Regarding the crystal orientation of the resulting oxide layer, the c-axis orientation rate is 99% or higher, the $\Delta\varphi$ value is 5.5 degrees or less, preferably 4.5 degrees or less, and more preferably 4 degrees or less, and the $\Delta\omega$ value is 6.8 degrees or less, preferably 4.8 degrees or less, and more preferably 4 degrees or less. By adjusting the angle α to 15 degrees or less, an area exhibiting the deviation of crystal direction by a particular extent or more from the given crystal direction on the oxide layer can be reduced, in comparison with conventional techniques. The expression "an area exhibiting the deviation of crystal direction by a particular extent or more from the given crystal direction" refers to a crystal area exhibiting angular difference from a given crystal direction (e.g., the (001) [110] plane) by a particular extent or more (e.g., about 4 degrees or more) when observed via the EBSD method. The reason why the crystal orientation of the oxide layer as the upper layer is much improved, in comparison with that of the lower layer, is not apparent. By adjusting the angle α to degrees or less, oxygen ions generated on the oxide target surface collide with the oxide layer during preparation thereof, and the oxide layer is thus formed under conditions in which lattice defects, such as oxygen loss, are less likely to occur. Thus, the $\Delta\varphi$ value and the $\Delta\omega$ value of the oxide layer are considered to be lower.

It is preferable that RF magnetron sputtering be carried out in an argon gas atmosphere. Alternatively, another inert gas, such as helium, neon, or krypton, may be used. While the gas pressure is not particularly limited, it is preferably set within a range from, for example, 0.01 Pa to 6 Pa. In addition, sputtering conditions are preferably determined so as to adjust the oxide film formation speed to between 1 nm/min and 30 nm/min.

When conducting RF magnetron sputtering, the temperature of the metal substrate is preferably regulated to 350° C. to below 600° C., and more preferably 400° C. to below 550° C. By regulating the temperature in the range from 350° C. to below 600° C., a preferable c-axis orientation rate of an oxide layer can be maintained.

While FIG. 1 shows an embodiment in which both the target 10 and the metal substrate 20 are in the form of disks, various forms can be employed, provided that the conditions are such that "the angle formed by a perpendicular at a film formation position on the metal substrate and a line from the film formation position to a point at which the perpendicular magnetic flux density is zero on a target located at the position nearest to the film formation position is adjusted to 15 degrees or less." When a superconducting wire is manufactured, for example, the target and the metal substrate may be prepared as elongated plates. In such a case, according to need, a partially open mask is provided between the target and the metal substrate, oxide layers exhibiting an angle α of 15 degrees or less are selectively formed, and, simultaneously, the metal substrate is transferred, so as to form an oxide layer covering the entire surface of the metal substrate. Alternatively, a plurality of targets in disk and square forms may be provided along the metal substrate.

An intermediate layer and a superconducting layer may be superposed in such order on the laminated substrate for a superconducting wire (i.e., the laminated substrate for epitaxial growth) obtained in the manner described above in accordance with a conventional technique, so that a superconducting wire can be manufactured. Specifically, one or more intermediate layers of $SrTiO_3$, MgO, $La_2O_3$, YSZ, $Y_2O_3$, or the like may be epitaxially deposited on the outermost layer of the laminated substrate for a superconducting wire, and a superconducting compound layer, such as REBaCuO (e.g., RE: Y, Gd, Ho, Sm, and Dy), may be further deposited thereon by, for example, sputtering, EB vapor deposition, metal organic deposition (MOD), pulsed laser deposition (PLD), metal organic chemical vapor deposition (MOCVD), or other techniques. Thus, a superconducting wire can be obtained. If necessary, a protective layer made of Ag, Au, Pt, Al, or an alloy thereof may further be provided on the superconducting layer.

When an intermediate layer is further provided between an oxide layer and a superconducting layer, as described above, such intermediate layer may not necessarily be formed via RF magnetron sputtering. For example, an intermediate layer may be formed by the electron beam deposition (EBD) method, the PLD method, or the thermal evaporation method.

EXAMPLES

Hereafter, the present invention is described in greater detail with reference to examples, comparative examples, and reference examples, although the technical scope of the present invention is not limited to these examples.

Examples and Comparative Examples

SUS316L (thickness: 100 μm) was used as a non-magnetic metal plate, and a copper foil (thickness: 48 μm) rolled at reduction of 96.8% was used as a high-reduction rolled metal layer. SUS316L and the copper foil were bonded to each other via surface activation at room temperature using a surface activation bonding apparatus. Thus, a laminate of SUS316L and the copper foil was formed. When conducting surface activation bonding, sputter etching was applied to the surfaces to be bonded at 0.1 Pa with a plasma output of 200 W for 20 seconds. Thus, layers of materials adsorbed to the surface of SUS316L and that of the copper foil were completely removed. A pressure of 600 MPa was applied with the use of pressure rolls.

The copper layer surface of the laminate was polished to have a surface roughness Ra of 20 nm or less, and the laminate was then subjected to thermal treatment in a non-oxidizing atmosphere of Ar at 250° C. for an annealing time of 5 minutes. Thereafter, the laminate was subjected to thermal treatment using a continuous thermal treatment furnace at 850° C. for an annealing time of 5 minutes. Thus, crystals of the copper foil were biaxially oriented, and the crystal-oriented metal layer was formed.

Subsequently, nickel was plated onto the crystal-oriented metal layer composed of the copper foil using the laminate as a cathode, so as to form a nickel-plated layer as a protective layer, and a metal substrate (φ 50 mm) comprising three layers of SUS, Cu, and Ni was prepared. The composition of the plating bath was as described below. That is, the plating thickness was 2.5 μm, the plating bath temperature was 60° C., and the pH level of the plating bath was 4. The resulting metal substrate was analyzed via X-ray diffractometry and EBSD in terms of the c-axis orientation rate, the $\Delta\varphi$ value, the $\Delta\omega$ value, the area exhibiting the deviation of crystal direction by 4 degrees to less than 6 degrees from the (001) [100] plane, and the area exhibiting the deviation by 6 degrees or more. The results of analysis demonstrate that the c-axis orientation rate of Ni on the outermost layer was 99% or higher, the Δφ value was 4.6 degrees, the Δω value was 5.32 degrees, the area exhibiting the deviation by 4 degrees to less than 6 degrees was 20.8%, and the area exhibiting the deviation by 6 degrees or more was 4.8%.

Figure 2:
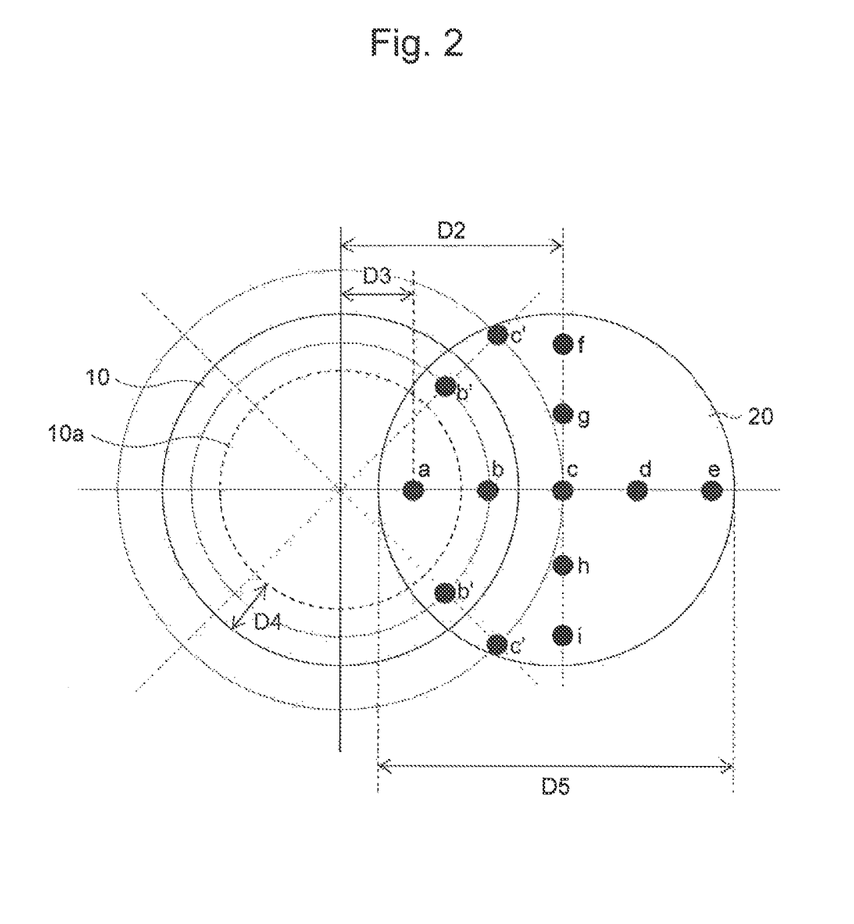
FIG. 2 shows a planar view showing the position of a metal substrate, the position of a target, and the position at which EBSD analysis is carried out on a metal substrate when conducting RF magnetron sputtering in examples and comparative examples.

(Sulfamate Bath)
Nickel sulfamate: 450 g/l
Nickel chloride: 5 g/l
Boric acid: 30 g/l
Additive: 5 ml/l Subsequently, the metal substrate was thermally treated in a reducing atmosphere of 1 Pa, such as Ar gas containing 3% of $H_2$ by mole, at 700° C. for 20 minutes, so as to remove Ni oxides from the surface. Subsequently, $CeO_2$ was prepared as the target, the surface of the metal substrate was provided in parallel with the surface of the target as shown in FIGS. 1 and 2, and an oxide layer of $CeO_2$ was formed on the metal substrate via RF magnetron sputtering. Thus, a laminated substrate for epitaxial growth was manufactured. In FIG. 1, the distance D1 from the target 10 to a plane including the metal substrate 20 was designated 40 mm, 60 mm, or 80 mm. In the planar view of FIG. 2, the center-to-center distance D2 between the target 10 and the metal substrate 20 is 30 mm, and the diameter D5 of the metal substrate 20 is 50 mm. The distance D4 from the circumference of the target 10 to the point 10a at which the perpendicular magnetic flux density was zero was 9 mm. RF magnetron sputtering was carried out in a Pa argon atmosphere by setting the temperature of the substrate to 400° C. The thickness of the formed oxide layer was about 200 mm at the center of the metal substrate.

The manufactured laminated substrate for epitaxial growth was analyzed and evaluated via EBSD in terms of the crystal orientation of $CeO_2$ at relevant positions, the Δφ value, the Δω value, the area exhibiting the deviation of crystal direction by 4 degrees to less than 6 degrees from the (001) [100] plane, and the area exhibiting the deviation by 6 degrees or more. FIG. 2 shows film formation positions (a) to (i) on the laminated substrate for epitaxial growth, which are to be analyzed. In a planar view, the distance D3 from the center of the target 10 to the film formation position (a) is 10 mm, and the film formation positions (a) to (i) are provided at equal intervals. The distance from the center of the target 10 to the position (b') and that to the position (c') are the same as the distance from the center of the target 10 to the position (b) and that to the position (e) in a planar view. Specific methods for analysis of the in-plane orientation degree (Δφ), the out-of-plane orientation degree (Δω), and the area exhibiting the deviation of crystal direction are described below. The results of analysis are shown in Table 1.

(1) In-Plane Orientation Degree (Δφ)

The in-plane orientation degree (Δφ) was determined through analyses conducted in the manner described below with the use of EBSD (SEM-840, JEOL Ltd. and DigiView, TSL Solutions, the same applies hereinbelow) and crystal direction analysis software (OIM Data Collection and OIM Analysis, EDAX, the same applies hereinbelow) with reference to the "crystal direction"<111>//ND.

1. In the crystal coordinate system, the axis <111> is rotated to be aligned with the ND [001] of the sample coordinate system.

2. Thereafter, the degree of inclination of the <111> axis of the crystal coordinate system at each measurement point relative to the ND [001] axis of the sample coordinate system is determined.

3. An inclination at each point is demonstrated on a cumulative graph. An inclination "Alignment" when "Number fraction" as the vertical axis is 0.5 is designated to be a half of Δφ. Accordingly, a value twice as large as the determined value is designated as the Δφ value.

(2) Out-of-Plane Orientation Degree (Δω)

The out-of-plane orientation degree (Δω) was determined through analyses conducted in the manner described below via EBSD and with the use of crystal direction analysis software with reference to the "crystal direction"<001>//ND.

1. The degree of inclination of the <001> axis of the crystal coordinate system at each measurement point relative to the ND [001] axis of the sample coordinate system is determined.

2. An inclination at each point is demonstrated on a cumulative graph. An inclination "Alignment" when "Number fraction" as the vertical axis is 0.5 is designated to be a half of Δω. Accordingly, a value twice as large as the determined value is designated as the Δω value.

(3) Area Exhibiting Deviation of Crystal Direction

The area exhibiting the deviation of crystal direction relative to an area of 1 $mm^2$ was determined via EBSD and with the use of the crystal direction analysis software. Specifically, the area exhibiting the deviation of crystal direction by 4 degrees to less than 6 degrees from the (001) [100] plane and the area exhibiting the deviation by 6 degrees or more were analyzed via assays of the protective layer (an Ni-plated layer) of the metal substrate. Also, the area exhibiting the deviation of crystal direction by 4 degrees to less than 6 degrees from the (001) [110] plane and the area exhibiting the deviation by 6 degrees or more were analyzed via assays of the oxide layer (the $CeO_2$ layer).

Specifically, in "Crystal Orientation," "Orientation" was set to (001) [100] when a metal substrate protective layer was to be assayed, and "Orientation" was set to (001) [110] when an oxide layer was to be assayed. Ranges of inclination therefrom were designated, and areas exhibiting the deviation within the respective ranges were determined.

TABLE 1

| Film-formation position | Ex. b | Ex. b' | Ex. b | Ex. a | Ex. a | Ex. b | Ex. a |
|---|---|---|---|---|---|---|---|
| Distance D1 (mm) | 80 | 60 | 60 | 80 | 60 | 40 | 40 |
| Angle α | 2.86 | 3.81 | 3.81 | 4.29 | 5.71 | 5.71 | 8.53 |
| Δφ | 3.02 | 2.82 | 2.90 | 3.37 | 3.01 | 3.27 | 3.18 |
| Δω | 3.17 | 2.32 | 2.4 | 3.62 | 2.54 | 3.35 | 3.37 |
| Proportion with deviation by 4 degrees to less than 6 degrees (%) | 6.83 | 2.87 | 3.53 | 11.5 | 3.33 | 8.53 | 8.57 |

TABLE 1-continued

| | | | | | | | |
|---|---|---|---|---|---|---|---|
| Proportion with deviation by 6 degrees or more (%) | 0.23 | 0.02 | 0.13 | 1.13 | 0.1 | 0.87 | 0.53 |

| Film-formation position | Ex. c | Ex. c' | Ex. c | Ex. g | Ex. h | Comp. Ex. i | Comp. Ex. f |
|---|---|---|---|---|---|---|---|
| Distance D1 (mm) | 80 | 60 | 60 | 60 | 60 | 60 | 60 |
| Angle α | 9.93 | 13.13 | 13.13 | 14.24 | 14.24 | 18.14 | 18.14 |
| Δφ | 3.14 | 3.115 | 3.25 | 3.91 | 3.99 | 4.09 | 4.46 |
| Δω | 3.19 | 3.07 | 3.14 | 3.64 | 3.82 | 4.14 | 4.6 |
| Proportion with deviation by 4 degrees to less than 6 degrees (%) | 6.5 | 5.59 | 4.8 | 6.87 | 7.73 | 11.47 | 14.6 |
| Proportion with deviation by 6 degrees or more (%) | 0.33 | 0.32 | 0.57 | 0.1 | 0.2 | 1.2 | 0.87 |

| Film-formation position | Comp. Ex. c | Comp. Ex. d | Comp. Ex. e | Comp. Ex. e | Comp. Ex. c | Comp. Ex. c |
|---|---|---|---|---|---|---|
| Distance D1 (mm) | 40 | 60 | 80 | 60 | 40 | 40 |
| Angle α | 19.3 | 21.80 | 23 | 29.54 | 31 | 40.4 |
| Δφ | 3.91 | 4.53 | 4.02 | 4.65 | 4.53 | 5.11 |
| Δω | 4.27 | 5.16 | 4.63 | 5.08 | 5.55 | 6.35 |
| Proportion with deviation by 4 degrees to less than 6 degrees (%) | 14.4 | 20 | 18.83 | 20.7 | 25.7 | 32.07 |
| Proportion with deviation by 6 degrees or more (%) | 1.26 | 2.0 | 2.77 | 3.77 | 6 | 9.6 |

As shown in Table 1, the angle α formed by the perpendicular at the film formation position 20a on the metal substrate 20 and a line from the film formation position 20a to the point 10a at which the perpendicular magnetic flux density is zero on the target 10 located at the position nearest to the film formation position 20a was adjusted to 15 degrees or less. Thus, the Δφ value of the oxide layer was improved by 0.5 degrees or more, compared with that of the outermost layer of the metal substrate 20 (Δφ: 4.6 degrees). By adjusting the angle α to 13.5 degrees or less, in particular, the Δφ value was improved by 1 degree or more, and the Δω value was improved by 1.2 degrees or more, in addition, a significant improvement was observed in terms of the Δω value (i.e., 2 degrees or more) by adjusting the angle α to 13.5 degrees or less. Further, it was found that the area exhibiting the deviation of crystal direction from the given crystal direction would be significantly reduced by adjusting the angle α to 15 degrees or less. The c-axis orientation rate of the oxide layer was 99% or higher at each of the film formation positions (a) to (i).

Reference Examples

A laminated substrate for epitaxial growth was manufactured in the same manner as in the examples above, except that a laminate comprising a metal substrate and an oxide layer of $CeO_2$ (a lower layer) formed thereon was used instead of the metal substrate 20, and another oxide layer of YSZ (an upper layer) was deposited on the lower layer via RF magnetron sputtering. The resulting laminate was evaluated in terms of crystal orientation at film formation positions where the angle α was 8.53 degrees. The results of evaluation are shown in Table 2.

TABLE 2

| | Ref. Ex. | Ref. Ex. | Ref. Ex. |
|---|---|---|---|
| Lower layer | $CeO_2$ | $CeO_2$ | $CeO_2$ |
| Δφ | 5.53 | 5.53 | 2.79 |

TABLE 2-continued

| | Ref. Ex. | Ref. Ex. | Ref. Ex. |
|---|---|---|---|
| Δω | 6.3 | 6.3 | 2.5 |
| Upper layer | YSZ | YSZ | YSZ |
| Angle α | 8.53 | 8.53 | 8.53 |
| Δφ | 6.14 | 5.65 | 2.9 |
| Δω | 6.92 | 6.38 | 2.54 |

As is apparent from Table 2, the improvement in the crystal orientation of the upper layer was less significant in comparison with that of the lower layer. This indicates that the method of film formation according to the present invention is applicable only when an oxide layer is formed on a crystal-oriented metal substrate.

DESCRIPTION OF NUMERAL REFERENCES

10: Target
10a: Point at which the perpendicular magnetic flux density is zero
20: Metal substrate
20a: Layer formation position All publications, patents, and patent applications cited herein are incorporated herein by reference in their entirety.

The invention claimed is:

1. A method for forming an oxide layer on a metal substrate via RF magnetron sputtering,
    the method comprising subjecting a crystal-oriented metal substrate exhibiting a c-axis orientation rate of 99% or higher on the outermost layer to RF magnetron sputtering by adjusting the angle formed by a perpendicular at a film formation position on the metal substrate and a line from the film formation position to a point at which the perpendicular magnetic flux density is zero on a target located at the position nearest to the film formation position to 15 degrees or less.
2. The method for forming an oxide layer according to claim 1, wherein the outermost layer exhibits a Δφ value of 6 degrees or less.

3. The method for forming an oxide layer according to claim 1, wherein the RF magnetron sputtering is carried out by adjusting the temperature of the metal substrate to 350° C. to below 600° C.

4. A method for manufacturing a laminated substrate for epitaxial growth comprising a metal substrate and an oxide layer formed thereon, the method comprising:

preparing a crystal-oriented metal substrate exhibiting a c-axis orientation rate of 99% or higher on the outermost layer; and forming an oxide layer on the metal substrate via RF magnetron sputtering by adjusting the angle formed by a perpendicular at a film formation position on the metal substrate and a line from the film formation position to a point at which the perpendicular magnetic flux density is zero on a target located at the position nearest to the film formation position to 15 degrees or less.

5. The method for manufacturing a laminated substrate for epitaxial growth according to claim 4, wherein the oxide layer is composed of $CeO_2$.

6. The method for manufacturing a laminated substrate for epitaxial growth according to claim 4, wherein the outermost layer of the metal substrate is composed of Ni or an Ni alloy.

7. A laminated substrate for epitaxial growth comprising a metal substrate and an oxide layer formed thereon, wherein the $\Delta\varphi_c$ value of the oxide layer and the $\Delta\varphi_m$ value of the outermost layer of the metal substrate, wherein $\Delta\varphi$ is measured by an electron back scatter diffraction method, satisfy the correlation represented by the formula: $\Delta\varphi_c \leq \Delta\varphi_m - 0.5$ degrees.

8. A laminated substrate for epitaxial growth comprising a metal substrate and an oxide layer formed thereon, wherein the $\Delta\omega_c$ value of the oxide layer and the $\Delta\omega_m$ value of the outermost layer of the metal substrate, wherein $\Delta\omega$ is measured by an electron back scatter diffraction method, satisfy the correlation represented by the formula: $\Delta\omega_c \leq \Delta\omega_m - 1.2$ degrees.

9. The method for forming an oxide layer according to claim 2, wherein the RF magnetron sputtering is carried out by adjusting the temperature of the metal substrate to 350° C. to below 600° C.

10. The method for manufacturing a laminated substrate for epitaxial growth according to claim 5, wherein the outermost layer of the metal substrate is composed of Ni or an Ni alloy.

11. The laminated substrate according to claim 7, wherein the $\Delta\varphi_c$ value of the oxide layer is 4.5 degrees or less.

12. The laminated substrate according to claim 8, wherein the $\Delta\omega_c$ value of the oxide layer is 4.8 degrees or less.

* * * * *